United States Patent
Yasui et al.

(10) Patent No.: US 7,029,594 B2
(45) Date of Patent: Apr. 18, 2006

(54) PLASMA PROCESSING METHOD

(75) Inventors: Naoki Yasui, Yamaguchi (JP); Masahiro Sumiya, Kudamatsu (JP); Hitoshi Tamura, Hikari (JP); Seiichi Watanabe, Tokuyama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 188 days.

(21) Appl. No.: 10/658,398

(22) Filed: Sep. 10, 2003

(65) Prior Publication Data

US 2004/0045673 A1    Mar. 11, 2004

Related U.S. Application Data

(63) Continuation of application No. 10/358,894, filed on Feb. 6, 2003.

(30) Foreign Application Priority Data

Feb. 15, 2002  (JP) .............................. 2002-037580
Sep. 20, 2002  (JP) .............................. 2002-275738

(51) Int. Cl.
*G01R 31/00* (2006.01)
*H01L 21/00* (2006.01)

(52) U.S. Cl. ............................. 216/61; 216/59; 216/67; 216/71; 438/710; 438/714; 156/345.28; 156/345.41; 156/345.44

(58) Field of Classification Search .................. 216/67, 216/71, 59, 61; 438/710, 714; 156/345.28, 156/345.41, 345.44
See application file for complete search history.

(56) References Cited

U.S. PATENT DOCUMENTS

| | | | | |
|---|---|---|---|---|
| 6,110,287 A | * | 8/2000 | Arai et al. | 156/345.34 |
| 6,129,806 A | * | 10/2000 | Kaji et al. | 156/345.46 |
| 6,319,355 B1 | * | 11/2001 | Holland | 156/345.48 |
| 6,656,849 B1 | * | 12/2003 | Ogino et al. | 438/714 |
| 6,806,201 B1 | * | 10/2004 | Sumiya et al. | 438/714 |
| 2003/0094239 A1 | * | 5/2003 | Quon et al. | 156/345.51 |

FOREIGN PATENT DOCUMENTS

| | | |
|---|---|---|
| JP | 55-090228 | 7/1980 |
| JP | 56-053853 | 12/1981 |
| JP | 5-174995 | 7/1993 |
| JP | 7-235394 | 9/1995 |

\* cited by examiner

*Primary Examiner*—Shamim Ahmed
(74) *Attorney, Agent, or Firm*—Antonelli, Terry, Stout and Kraus, LLP.

(57) ABSTRACT

A plasma processing method for providing plasma processing to an object to be processed disposed within a vacuum processing chamber in which a process gas feeding device feeds process gas into the vacuum processing chamber, a wafer electrode is placed within the vacuum processing chamber for mounting the object to be processed, a wafer bias power generator applies self-bias voltage to the wafer electrode, and a plasma generator generates plasma within the vacuum processing chamber. The plasma processing method flattens either a positive side voltage or a negative side voltage of a voltage waveform of a high frequency voltage generated to the object at an arbitrary voltage.

12 Claims, 15 Drawing Sheets

EVACUATION

PLASMA PROCESSING METHOD

CROSS REFERENCE TO RELATED APPLICATION

This is a continuation of U.S. application Ser. No. 10/358,894, filed Feb. 6, 2003, the subject matter of which is incorporated by reference herein.

FIELD OF THE INVENTION

The present invention relates to an apparatus and method for plasma processing, and especially relates to the apparatus and method for plasma processing that enable very fine processing.

DESCRIPTION OF THE RELATED ART

Conventionally, when plasma is utilized to perform etching, process gas is dissociated to improve the activation efficiency and to thereby increase processing speed, and high frequency power is supplied to the object to be processed in order to have ions vertically incident on the object, so as to provide anisotropic property to the etching direction and to enable very fine etching. Such plasma processing apparatus is disclosed for example in Patent Document 1, according to which an air-core coil is provided to the outer periphery of a vacuum vessel, and electromagnetic waves such as microwaves, UHF waves and VHF waves are introduced through a transmission line into a processing chamber so as to form plasma by electron cyclotron resonance, and the incident energy of ions on the object within the plasma is controlled by a high frequency power supply connected to the substrate holder (wafer electrode). High aspect ratio etching processes for forming deep trenches (or holes), HARCs (high aspect ratio contacts) and the like are performed by utilizing the above-mentioned apparatus and selecting the most appropriate process conditions including the type, pressure and flow rate of the process gas, the output of the electromagnetic wave power supply for generating plasma, the output of the high frequency power supply for controlling the ion energy, the temperature of the wafer-mounting electrode, and the magnetic field profile.

Further, a known means for fixing the object to be processed on a substrate holder is disclosed in Patent Document 2, which discloses supplying high frequency power to a water-cooled substrate holder, mounting the object on the substrate holder via a dielectric film, applying DC voltage to the substrate holder to generate electrostatic chucking force, and chucking the object onto the substrate holder.

Patent Document 1: Japanese Patent Laid-Open Publication No. 07-235394

Patent Document 2: Japanese Patent Publication No. 56-53853

According to such a conventional plasma processing apparatus, a high frequency voltage of a sine wave form is applied to the substrate holder (wafer electrode), so the energy of the ions incident upon the object (substrate) is determined by self-bias voltage being generated by the high frequency power supplied to the object. In this case, the ion energy distribution of the ions incident upon the object is substantially fixed to a saddle-peak form wherein the energy peaks appear on both the low energy side and the high energy side. The ions of the high energy peak contribute to the etching process, but the ions of the low energy peak rarely contribute to the process. The ratio of the amount of ions of the high energy side and those of the low energy side is substantially 1:1. Even when the high frequency voltage is varied, the high/low energy ion ratio does not change. Therefore, the drawback of the conventional plasma processing apparatus is that the etching efficiency is not very good. The width of the ion energy distribution depends on the frequency of the high frequency power supply and the thickness of the ion sheath related to the plasma density and the high frequency voltage being applied.

On the other hand, in a semiconductor device processing, there is a demand for high aspect ratio processing such as forming of deep trenches (holes) and HARCs etc., for isolation, capacitor formation, contact plug, and so on. In high aspect ratio processing, however, there is a problem that as the aspect ratio increases, the etching rate drops (micro-loading) due to the following reasons; (1) insufficient substitution of radicals and reaction products., and (2) decrease in ion flux and ion energy by charging. Thus, in order to provide a process that realizes the desired etch depth, it is very important that the mask selectivity be improved.

Moreover, in recent years, the outer diameter of the object to be processed or silicon wafer is enlarged from 200 mm to 300 mm so as to improve productivity. Thus, the ratio Sw/Sg of the area Sw of the wafer mounting electrode to which high frequency voltage is applied and the area of the earth Sg in the processing chamber increases. As a result, the absolute value of the self bias voltage reduces, and the plasma potential increases. Since an ion sheath is created near the earth of the processing chamber corresponding to the plasma potential, when the plasma potential increases, the high energy ions accelerated within the ion sheath cause the side walls of the processing chamber (effective earth portion) to be sputtered, causing problems such as increase of metal contamination. Moreover, the increase in dispersion of plasma to the lower area of the processing chamber leads to the increase in the generation of contaminants, causing the yield factor to drop. Even further, charging damage is increased along with the rise in plasma potential.

SUMMARY OF THE INVENTION

The present invention is aimed at solving these problems, and provides a plasma processing apparatus and a plasma processing method that enable very fine processing.

The present invention adopts the following means to solve the problem:

A plasma processing apparatus for providing plasma processing to an object to be processed, comprising a vacuum processing chamber in which the object is disposed, a process gas feeder for feeding process gas into the vacuum processing chamber, a wafer electrode equipped within the vacuum processing chamber for mounting the object, a wafer bias power generator for supplying self-bias voltage to the wafer electrode, and a plasma generating means for generating plasma within the vacuum processing chamber, wherein the wafer bias power generator includes a clip circuit for clipping at least either a positive voltage or a negative voltage of the wafer bias power generator to a predetermined voltage.

DETAILED DESCRIPTION OF THE PREFERRED EMBODIMENT

Embodiment 1

Figure 1:
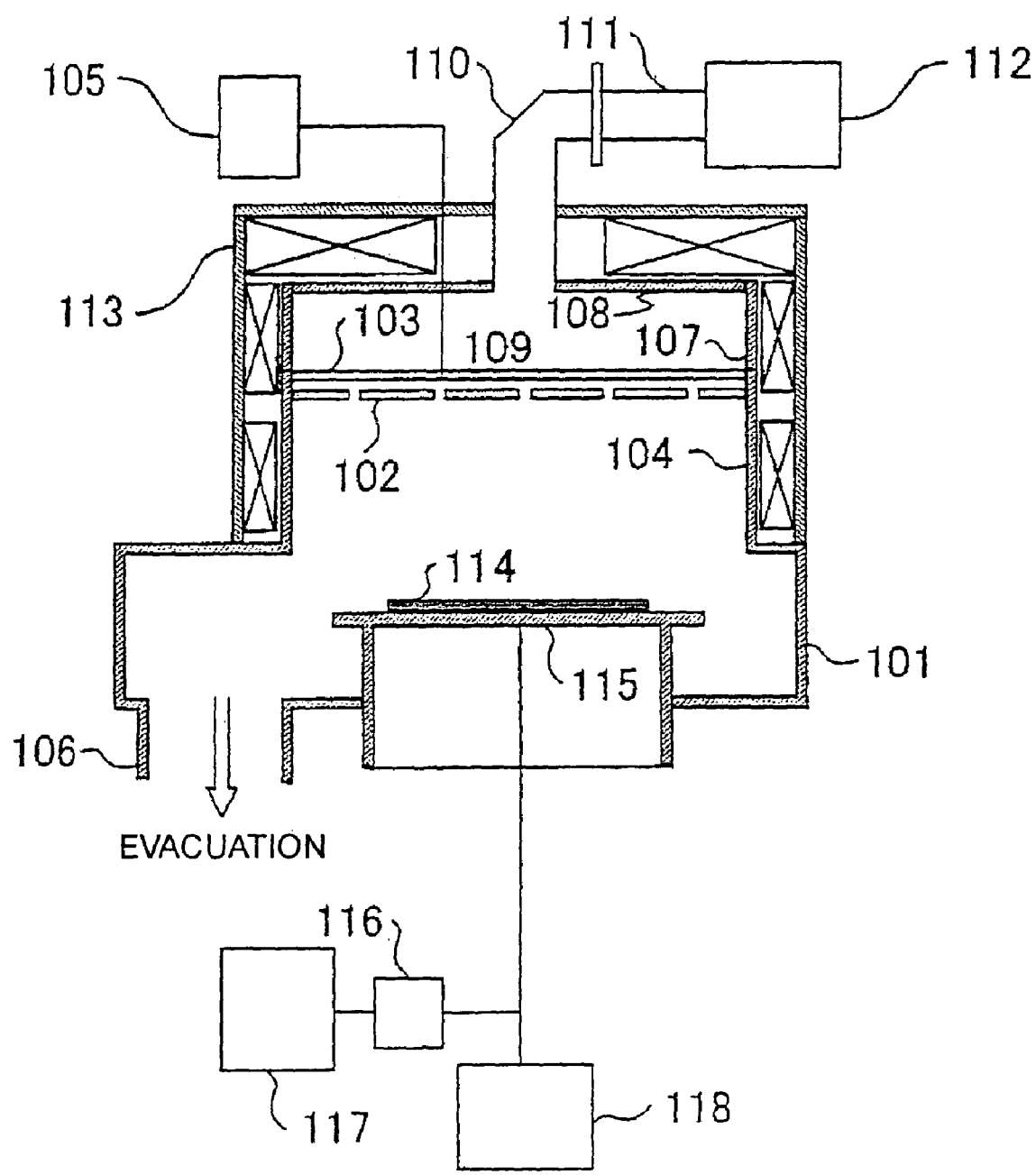
FIG. 1 is a view explaining a plasma processing apparatus according to the first embodiment of the present invention.

Now, the first embodiment of the present invention will be explained with reference to FIGS. 1 through 8. FIG. 1 is a vertical cross-sectional view of an etching apparatus according to one embodiment of a plasma processing apparatus to which the present invention is applied. On the upper area of a vacuum vessel 101 having an opened top portion are disposed a shower plate 102 (made for example of quartz) for introducing etching gas into the vacuum vessel 101 and a dielectric window 103 (made for example of quartz), and the area is sealed to create a processing chamber 104. The shower plate 102 has a porous structure so as to allow etching gas to flow through, and is connected to a gas feeder 105. Further, an evacuator (not shown) is connected via an evacuation opening 106 to the vacuum vessel 101. Above the dielectric window 103 is disposed a cylindrical wall 107 having a diameter substantially equal to the processing chamber 104 and in electrical contact with the processing chamber 104. At the upper opening of the cylindrical wall 107 is disposed a top plate 108 electrically connected with the wall 107 and having a round opening at the center thereof. The dielectric window 103, the cylindrical wall 107 and the top plate 108 surround and define a cylindrical space 109.

The cylindrical space 109 is connected via a circle/rectangle converting waveguide 110 to a rectangular waveguide 111 and an electro magnetic wave generating power supply 112 (for example, a magnetron source). The electromagnetic wave (for example a microwave) generated at the electromagnetic wave generating power supply 112 (for example, a magnetron source) travels through the rectangular waveguide 111 and passes through the circle/rectangle converting waveguide 110 into the cylindrical space 109.

A magnetic field generating coil 113 for creating a magnetic field within the processing chamber 104 is disposed to the outer periphery of the processing chamber 104. A wafer electrode 115 for mounting the object to be processed 114 is disposed to the lower area of the vacuum vessel 101, which is connected via an impedance matching network 116 to a wafer bias power generator 117 (frequency of which is 400 kHz, for example). The upper surface of the wafer electrode 115 is covered with a dielectric film, and the application of a DC voltage from an electrostatic chuck power supply 118 connected to the wafer electrode 115 chucks the object 114 mounted on the dielectric film to the wafer electrode.

Figure 2:
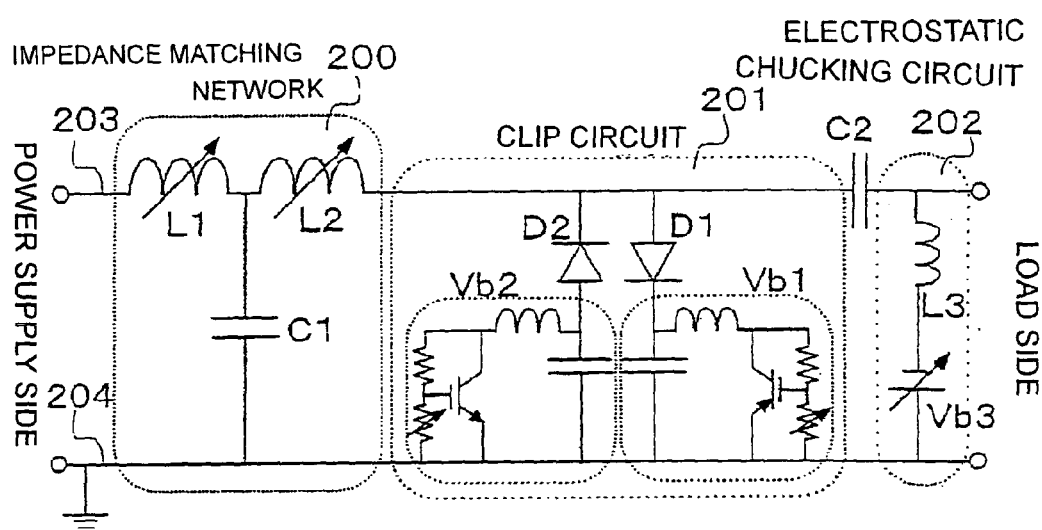
FIG. 2 is a view illustrating an example of a circuit arrangement of an impedance matching network and an electrostatic chuck.

FIG. 2 shows the circuitry of the impedance matching network 116 and the electrostatic chucking power supply 118. Between an active line 203 and a ground line 204 and toward the load from an impedance matching network 200 composed of inductors (L1, L2) and a capacitor (C1) are disposed a clip circuit 201 having diodes (D1, D2) and DC power supply units (Vb1, Vb2) connected in series (which can be a high frequency voltage waveform control circuit for flattening the high frequency voltage of the wafer bias power generator 117) and an electrostatic chucking circuit 202 having an inductor (L3) and a DC power supply (Vb3) connected in series. At this time, a capacitor (C2) is inserted to the active line connecting the clip circuit and the electrostatic chucking circuit. The operation voltage of diode (D1) is set by setting up the value of DC power supply (Vb1) so that the diode (D1) in the clip circuit 201 cuts the positive voltage portion of the high frequency voltage and then the DC power supply (Vb1) provides positive potential thereto. The operation voltage of diode (D2) is set by setting up the value of DC power supply (Vb2) so that the diode (D2) cuts the negative portion of the high frequency voltage and then the DC power supply provides negative potential thereto.

Further, by varying the voltage of the DC power supplies (Vb1, Vb2) with time, the inclination of the flat portion of the clipped high frequency voltage waveform can be controlled arbitrarily. Also, by varying the capacity of the capacitor disposed at the output portion of the DC power supplies (Vb1, Vb2), the inclination of the flat portion of the high frequency voltage waveform can be controlled. Especially, by reducing the capacity of the capacitor, the absolute value of the voltage of the flat portion can be controlled to increase with time. Based on this circuit structure, the positive side and the negative side of the voltage waveform can be clipped to an arbitrary value (flattened or cut), and further, the inclination of the clip portion (flat portion) can be controlled.

Moreover, DC voltage is applied to the wafer electrode 115 from DC power supply (Vb3), and by this DC voltage and the self bias voltage generated by the plasma process, the object 114 to be processed is chucked to and supported by the wafer electrode 115 by electrostatic chucking. The capacitor (C2) intercepting the clip circuit 201 and the electrostatic chucking circuit 203 at DC level enables the operation voltage of diodes (D1, D2) to become stable and the current-carrying capacity of the DC power source (Vb3) to become small. When there is no capacitor (C2), the current passing through the DC power supplies (Vb1, Vb2) via diodes (D1, D2) drops its voltage due to the internal resistance of the DC power supply (Vb3), so the operation voltage of the diodes (D1, D2) change. In order to stabilize the operation voltage of diodes (D1, D2), the current-carrying capacity of the DC power supply (Vb3) must be increased. In short, the capacitor (C2) is inserted so as to intercept the clip circuit 201 and the electrostatic chucking circuit 203 at DC level and prevent mutual influence.

Figure 3:
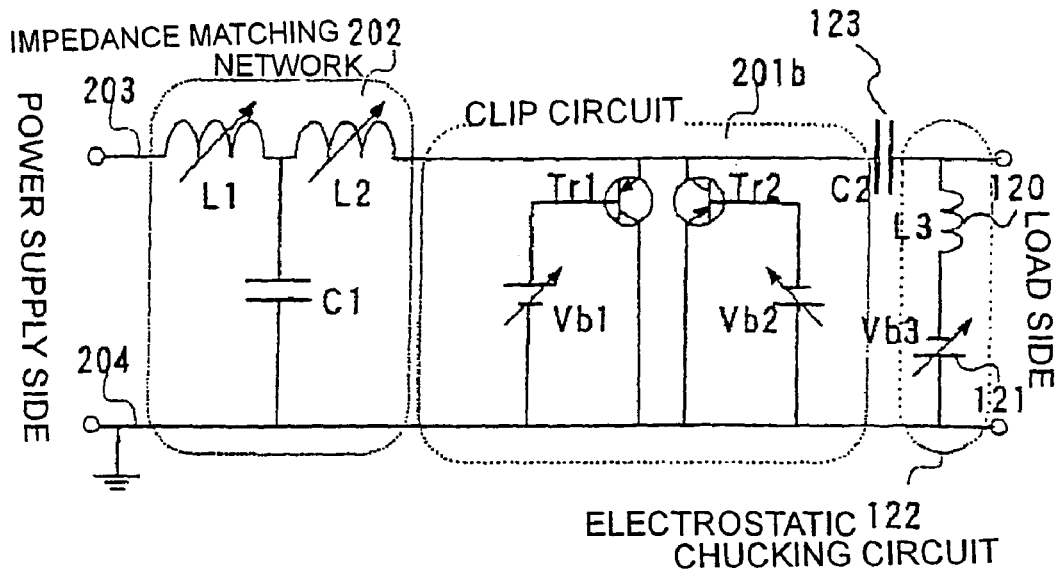
FIG. 3 is a view illustrating another example of a circuit arrangement of the impedance matching network and the electrostatic chuck.

FIG. 3 illustrates another example of the arrangement of the impedance matching network 116 and the electrostatic chuck power supply 118. Switching elements (such as transistors Tr1, Tr2) are disposed between the active line 203 and the ground line 204 toward the load from the impedance matching network 202, and DC power sources Vb1, Vb2 are connected to the base electrodes of transistors Tr1, Tr2, thereby forming a clip circuit 201b. The DC power supplies Vb1, Vb2 are set to an arbitrary voltage, and the voltage is used to enable the transistors to perform switching operation. According to this circuit, the power-supply-side voltage can be clipped with high accuracy to an arbitrary voltage.

Figure 4:
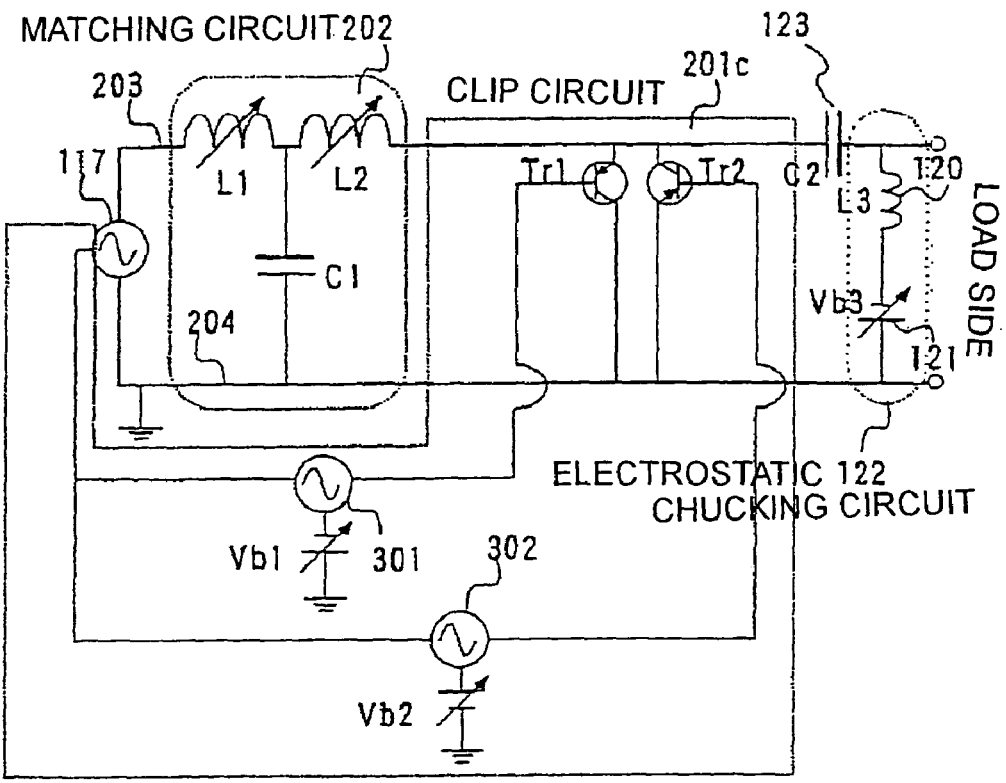
FIG. 4 is a view showing yet another example of a circuit arrangement of the impedance matching network and the electrostatic chuck.

FIG. 4 shows yet another example of the circuit of the impedance matching network 116 and the electrostatic chuck power supply 118. Switching elements (such as transistors Tr1, Tr2) are disposed between the active line 203 and the ground line 204 toward the load from the impedance matching network 203, and power supplies 301, 302 enabling switching operation are connected to the base electrodes of transistors Tr1, Tr2, thereby forming a clip circuit 201c. The power supplies 301, 302 enabling switching operation are synchronized with the wafer bias power source 117 with the same frequency, and DC power supplies Vb1, Vb2 each connected to the power supplies 301, 302, respectively, enable independent offset application. By switching the transistors Tr1, Tr2 through the power sources 301, 302 by an arbitrary time width within the bias period, the power supply-side voltage can be clipped with high accuracy to an arbitrary voltage.

According to the apparatus shown in FIG. 1, the interior of the processing chamber 104 is decompressed by the evacuator (not shown), before introducing etching gas to the processing chamber 104 from a gas feeder 105 and adjusting the pressure to a desired level. A microwave power generated by the power supply 112 for electromagnetic wave generation and having a frequency in the microwave band of 2.45 GHz, for example, is introduced through the rectangular coaxial line 111 and via the circle/rectangle converting waveguide 110 into the cylindrical space 109. The microwave introduced to the cylindrical space 109 is then transmitted through the dielectric window 103 and shower plate 102 into the processing chamber 104, and generates a high density plasma within the processing chamber 104 interacting with the magnetic field created by the magnetic field generating coil 113 (for example, a solenoid coil). Especially, high density plasma can be created efficiently by generating a magnetic field intensity (for example, 0.087–5 T) that causes electron cyclotron resonance in the processing chamber 104 by the coil 113. The wafer bias power source 117 supplies high frequency power to the object 114 mounted on the wafer electrode 115, subjecting the object to surface treatment (such as etching).

Figure 5:
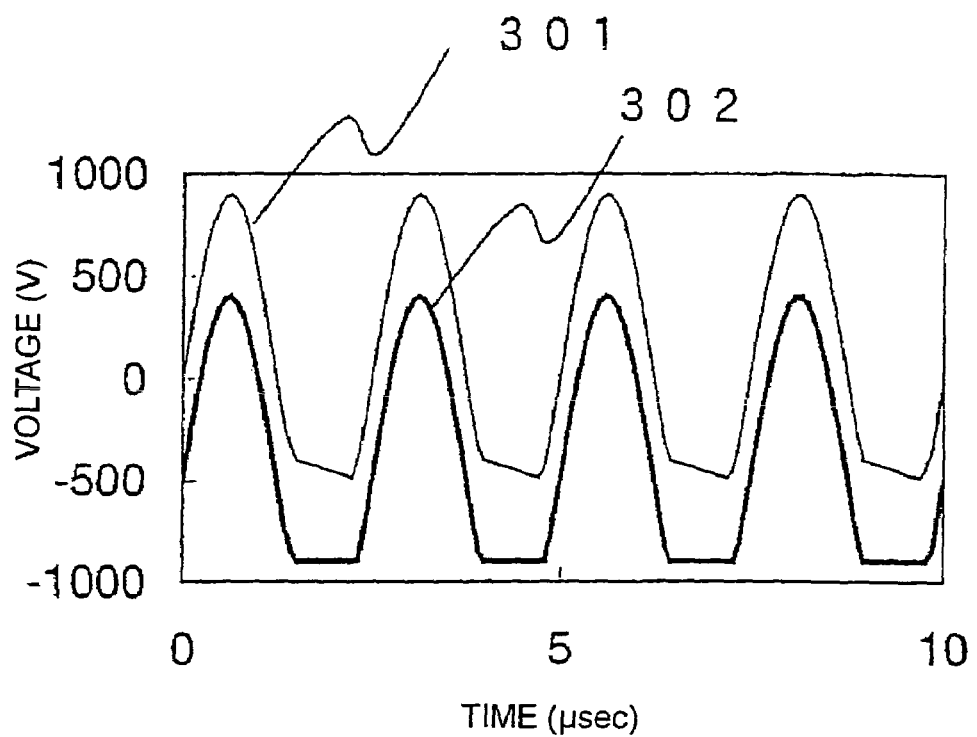
FIG. 5 is a view showing the voltage waveform with the negative-side voltage clipped.

FIG. 5 illustrates a voltage waveform 301 having the negative-side voltage clipped by the clip circuit of impedance matching network 116. This voltage is applied to the substrate electrode 115 for example through the electrostatic chucking circuit. In the drawing, the vertical axis represents voltage and the horizontal axis represents time.

As explained, by arbitrarily setting up the DC power supply unit (Vb1, Vb2) in the clip circuit 201 shown in FIG. 2, it is possible to clip (flatten) the voltage waveform of a sine wave with a frequency of 400 kHz at an arbitrary voltage, and to control the inclination of the flat portion. In the present example, the substrate is supported by electrostatic chuck on the wafer electrode 115 covered with a dielectric film. Therefore, the high frequency voltage applied from the wafer bias power generator 117 to the electrode is transmitted to the substrate via the dielectric film functioning as a capacitor. Thus, by applying the flatly clipped high frequency voltage waveform via the above-mentioned capacitance to the wafer electrode 115, the waveform of the voltage generated to the substrate will have a sloped (sagged) flat portion.

Therefore, by creating a sloped flat portion that increases in absolute value with time in the voltage waveform applied to the wafer electrode 115 (like the voltage waveform 301 of FIG. 5), the voltage waveform generated to the substrate mounted on the wafer electrode via the dielectric film is made to have a waveform with a flat portion clipped at a fixed voltage (like the voltage waveform 302 of FIG. 5).

Figure 6:
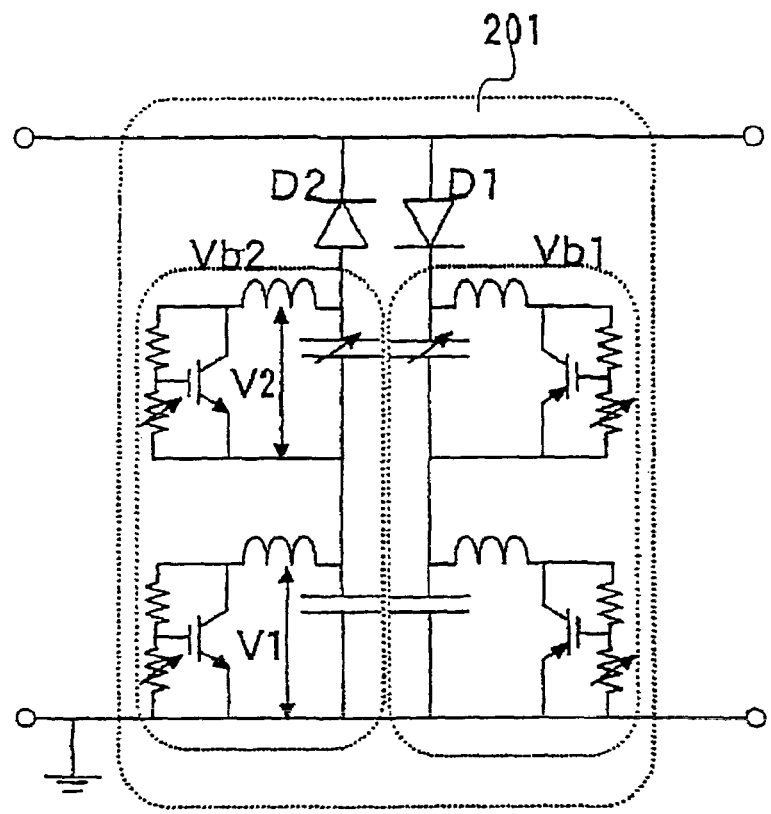
FIG. 6 is a view showing an example of a DC power supply unit including a capacitor having a multistage configuration.
Figure 7:
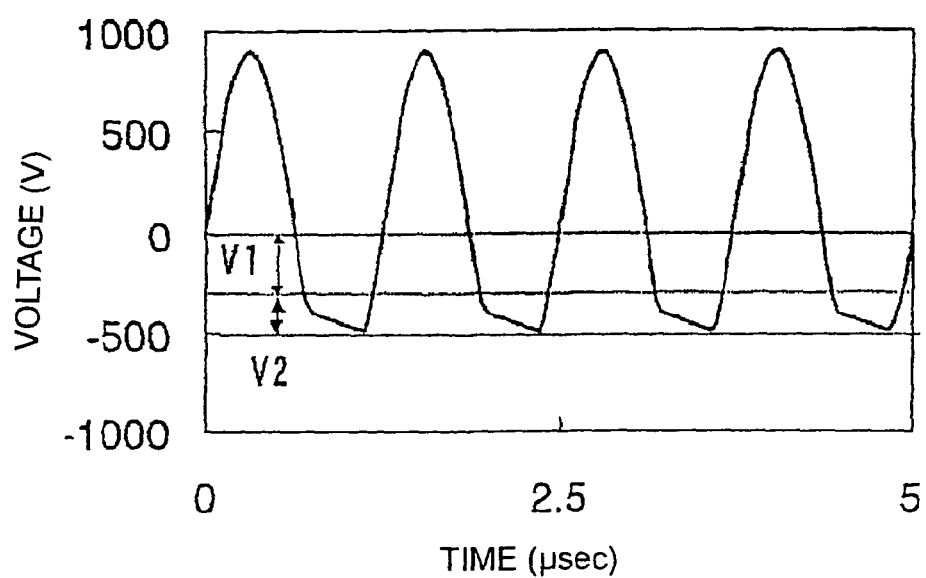
FIG. 7 shows an example where the clip voltage and the inclination of the flat-area voltage are controlled.

The clip circuit shown in FIG. 2 comprises a DC power supply unit having a single-stage formation including a capacitor, but the power supply unit can be designed to have a multistage formation as shown in FIG. 6. In the example of FIG. 6, the capacity of the DC power supply unit V1 is set large, and the variable capacity of the DC power supply unit V2 is set small. Thus, as shown in FIG. 7, the inclination of the clip voltage and the flat portion voltage can be controlled respectively. The clipping of the negative-side voltage is explained above, but the clipping of the positive-side voltage can be performed similarly.

FIG. 8(a) shows in 3D form the energy distribution of ions incident upon the object 114 when the Vpp (peak-to-peak voltage) of the high frequency voltage waveform of a sine wave is varied. The vertical axis shows the ion flux (arbitrary unit) and the horizontal axis shows the ion energy, wherein the Vpp is reduced in the order of voltage waveform 401, 402, 403. It is known that in general, the ion energy distribution when high frequency power is applied to the wafer (object to be processed) has two peaks, one in the high energy side and one in the low energy side, as is disclosed in M. J. Kushner, J. Appl. Phys. 58, 4024 (1985).

FIG. 8(b) shows the energy distribution of ions incident upon the object 114 when the DC power supply unit (Vb2) is varied to control the voltage waveform 302. FIG. 8(b) shows in 3D form an ion energy distribution waveform 401 in which sine wave voltage is applied to the wafer electrode 115, an ion energy distribution waveform 404 in which the flat portion of the voltage waveform generated to the object 114 is set to −800 V, and an ion energy distribution waveform 405 in which the flat portion of the voltage waveform generated to the object 114 is set to −600 V.

As shown in FIG. 8(a), even if the voltage having a sine wave Vpp is increased, the ratio of high energy peak to low energy peak does not vary. However, as shown in FIG. 8(b), by clipping the sine wave and varying the voltage of the flat portion to −800V and −600V, the ratio of the high energy peak can be increased. In other words, an ion energy distribution close to monochrome is achieved. By utilizing the above property, high aspect ratio processing such as deep trench (or hole) and HARC can be realized.

For example, in forming a deep trench, a Si substrate is etched using $SiO_2$ as mask. When forming a capacitor for CMOS, the etching must reach a depth of 8 to 10 μm with an opening diameter of 0.2 to 0.15 μm, so a very fine processing in the vertical direction with an aspect ratio of 50 to 100 including the mask must be performed. Etching gas such as $SF_6/HBr/O_2/SiF_4$ or $NF_3/HBr/O_2$ can be used. The above-explained application of the voltage waveform having a clipped sine wave to the wafer results in an ion energy distribution close to monochrome, and ions are effectively introduced vertically into the hole or trench with high aspect ratio, enabling high-speed and high aspect ratio processing.

Similarly, when forming a HARC for a contact hole, an etching gas such as $Ar/C_5F_8/O_2$, $Ar/C_4F_8/O_2$ or a mixture adding CO to these gases can be used to etch $S_iO_2$ using resist as mask. Since gases belonging to the CF system are used to form HARC, with a high aspect ratio the radical composition within the hole may change and etch-stop may occur. However, the application of a voltage waveform having a clipped sine wave to the wafer results in an ion energy distribution close to monochrome, improving the release property of the etch and increasing the etching rate. The above explanation relates to forming a deep trench (or hole) for a capacitor and a HARC for a contact hole, but the present embodiment can be applied to other examples to realize the same advantageous effects, such as to the formation of a deep trench for isolation, processing of a contact plug, forming of a super-connect of a multilayer chip, or to fields other than the semiconductor device that include high aspect ratio processing for a micromachine and MEMS (micro electromechanical system) The present embodiment realizes an ion energy distribution close to monochrome, so fine processing property is improved.

In the formation of a transistor gate, a gate-length CD control must be realized to achieve desired device property. A poly-Si gate is etched for example with $HBr/Cl_2/O_2$, and the application of the above-mentioned voltage waveform (clipped sine wave) to the wafer enables desirable ion energy allowing vertical processing, thus improving CD controllability. The same desirable effects can be achieved when creating a metal gate or a damascene gate. CD control is important in forming a hard mask using resist as mask, and the application of the present embodiment thereto also realizes the same effects.

Moreover, by changing the clip voltage and varying the ratio of high energy ions and low energy ions, the etching shape such as the taper angle etc. can be controlled without varying the processing conditions such as gas and pressure. This method is effective not only for the formation of gates, deep trenches (holes) and HARCs, but also for the wiring process of damascene structures and Al wiring, or the processing of STI. Especially in an STI (shallow trench isolation) process using $Cl_2/O_2$ gas, a rounding treatment must be performed to the opening portion (top round) and the bottom portion (bottom round) so as to modify stress concentration. In this process, rounding treatment is realized by varying the clip voltage either gradually or in multiple steps during etching.

Figure 8:
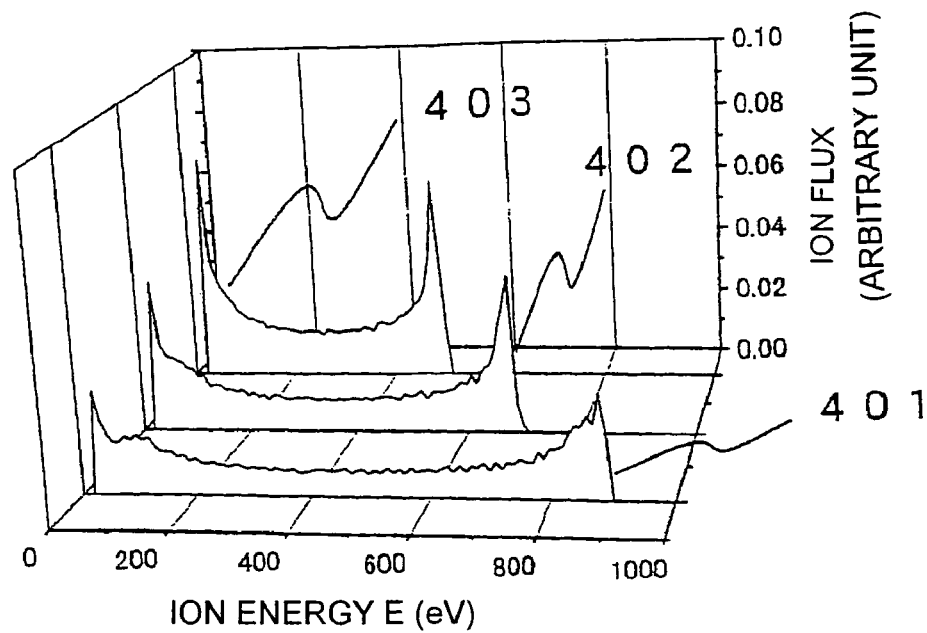
FIG. 8 shows the energy distribution of ions incident upon the object to be processed.
Figure 8:
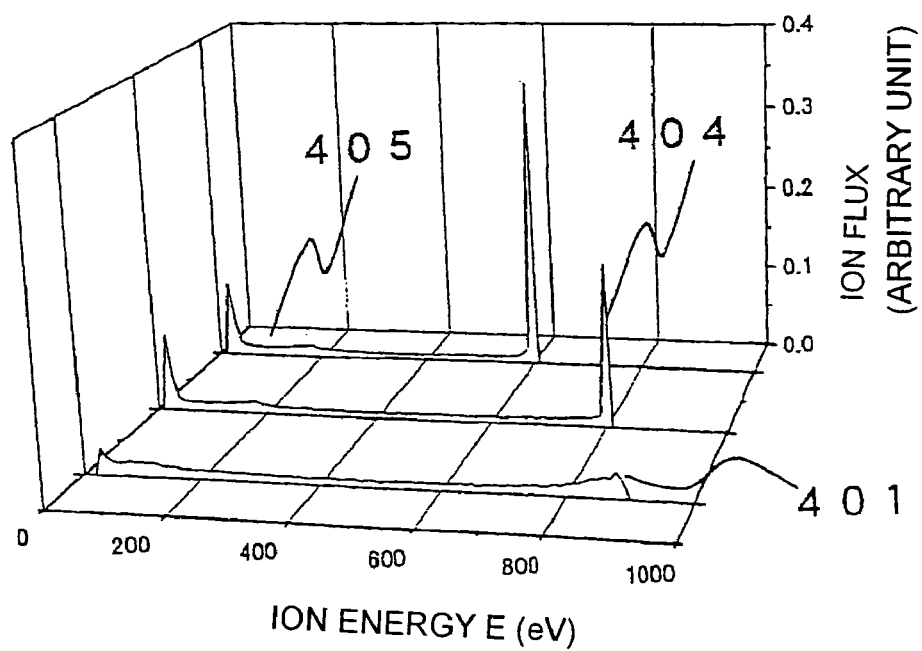
Figure 9:
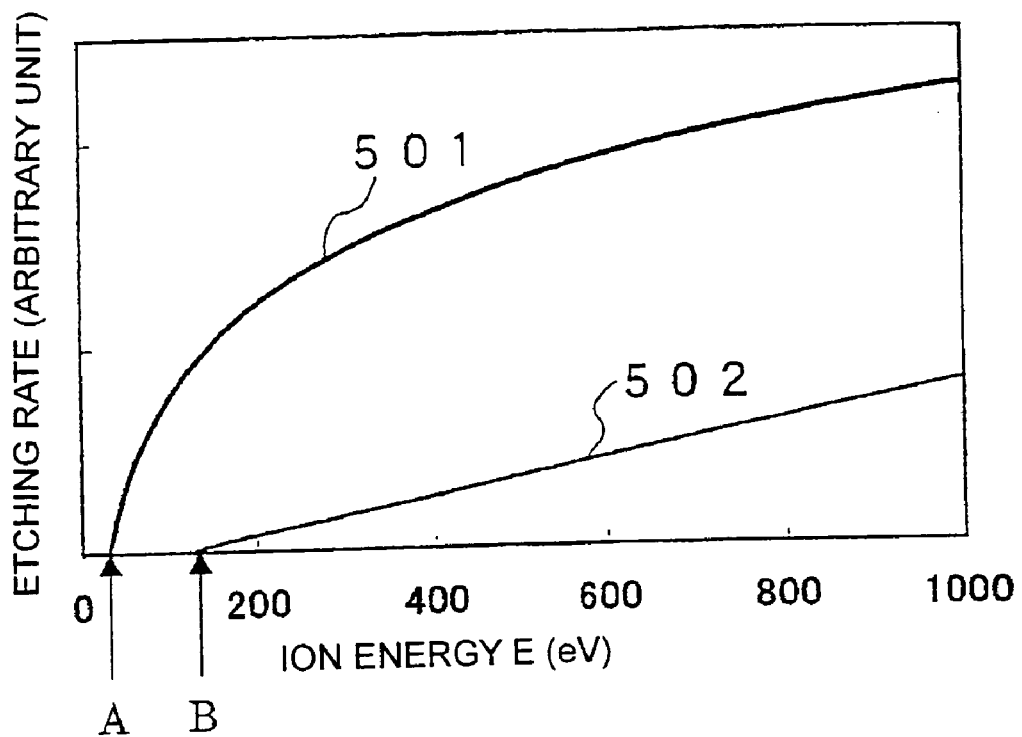
FIG. 9 shows the relationship between the ion energy and the etching rate of the object to be etched.

The relationship between the incident ion energy and the etching rate (etch yield) generally differ according to the material being etched. Therefore, by utilizing this feature and the monochrome ion energy distribution, a high selectivity etching can be realized. In other words, one must simply select the ion energy having a small etching rate to the mask material or base material but having a large etching rate to the etching object. As an example, FIG. 9 shows the relationship of the etching rate of the material to be etched (such as silicon) and the mask material (such as silicon oxide) to the ion energy (E) in a high aspect ratio deep trench etching. In the drawing, the etching rate of the material to be etched (for example, silicon) is shown by line 501, and the etching rate of the mask material (for example, silicon oxide) is shown by line 502. By increasing the ion energy from 0 eV, a threshold ion energy appears where etching starts. This threshold is A (eV) for the object etching material, and B (eV) for the mask material. Therefore, by selecting ions having a monochrome ion energy distribution between A (eV) and B (eV) to be incident upon the wafer, the selectivity of the etch object material and mask material becomes infinite in theory. With the ion energy distribution being as shown in FIG. 8, the etching rate (ER) of each material can be computed by following formula (1) based on the ion energy distribution γ (E) and the relationship Ψ (E) between the etching rate and the ion energy as shown in FIG. 9.

$$ER = \int_0^\infty \psi(E) \cdot \gamma(E) \, dE \qquad \text{[Formula 1]}$$

Figure 10:
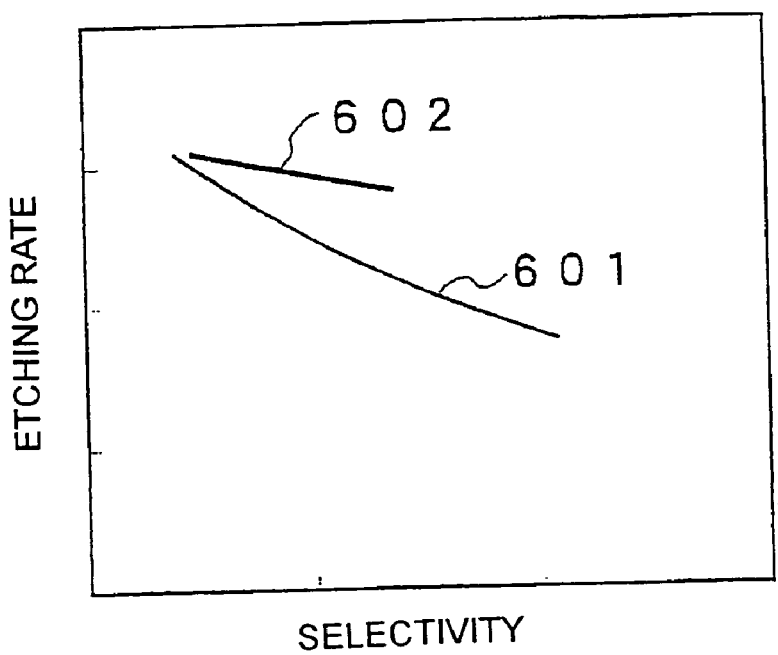
FIG. 10 shows the relationship between the etching rate of the object and the selectivity of the object and mask.

FIG. 10 shows the relationship between the etching rate of the object to be etched and the selectivity of the object to be etched to the mask material. In the drawing, the curve 601 shows the state where the Vpp (peak to peak voltage) of the sine wave voltage is varied as in FIG. 8(a), and curve 602 shows the state where the clip voltage is varied as in FIG. 8(b). As shown in FIG. 8(b), the increase of the ratio of high energy ions leads to higher selectivity at the same etching rate. This results in improving the selectivity between the resist as mask material and $SiO_2$ as material to be etched in HARC etching, improving the selectivity between the resist as mask material and Al as material to be etched in etching Al using $BCl_3/Cl_2$, improving the selectivity between the organic low-k material such as FLARE and SiLk as material to be etched and $SiO_2$ as mask material in an organic low-k (low permittivity) etching using either $N_2/H_2$ or $NH_3$, and improving the selectivity in an inorganic low-k etching.

The etching of a wiring material is not limited to Al etching, but can be applied to TiN, W and the like. The etching of a low-k material can be applied to FSG, MSQ and so on. Other than improving the selectivity between the mask material and object to be processed, the present embodiment can be used to effectively improve the selectivity between the material to be processed and the base material. Especially when processing a gate material, the thickness of the base oxide film is very thin (in the order of a few nm), so a high selectivity is required. Also in this case, by providing to the wafer a voltage waveform with a clipped sine wave, the ratio of high energy ions can be increased, and the selectivity can be improved based on the relationship between the etching yield and the ion energy of the Poly-Si (gate material) and $SiO_2$ (base material). Further, SiGe or metallic materials can be applied as gate material, and nitride film can be applied as base material. Similar effects can be achieved for organic low-k etching where SiOC is used as material to be etched and SiC is used as base. Similar effects can further be achieved for high aspect ratio etching forming deep trenches (holes) and HARCs where high selectivity is required between the object material and mask material.

The incident of high energy ions on the object to be etched may cause lattice defect and provide damage thereto. For example, the etching of a contact hole may increase contact resistance. However, according to the ion energy control of the present embodiment, the etching process has a secure etch rate which at the same time is damage-free, enabling a high-quality surface treatment with improved throughput and high yield factor.

FIG. 11(a) shows a voltage waveform 701 and plasma potential waveform 702 generated to the object 114 to be processed when sine wave voltage is applied to the, wafer electrode 115. The vertical axis represents voltage and the horizontal axis represents time. Generally, the plasma potential generated by applying high frequency power to a wafer electrode fluctuates greatly depending on the amplitude of the positive-side voltage of the high frequency voltage, as disclosed in "Basis of Plasma Processing" DenkiShoin Publishers, 1985, pp. 150–156. FIG. 11(b) shows a voltage waveform 703 and plasma potential 704 generated to the object 114 to be processed when the positive voltage is clipped using the clip circuit 201 of an impedance matching network 116 and the inclination of the plane portion controlled. The DC power supply unit (Vb1, Vb2) in the clip circuit of FIG. 2 can be set arbitrarily so as to clip the voltage waveform having a sign wave with a frequency of 400 kHz at an arbitrary voltage, and to adjust the inclination of the formed flat portion.

Figure 11:
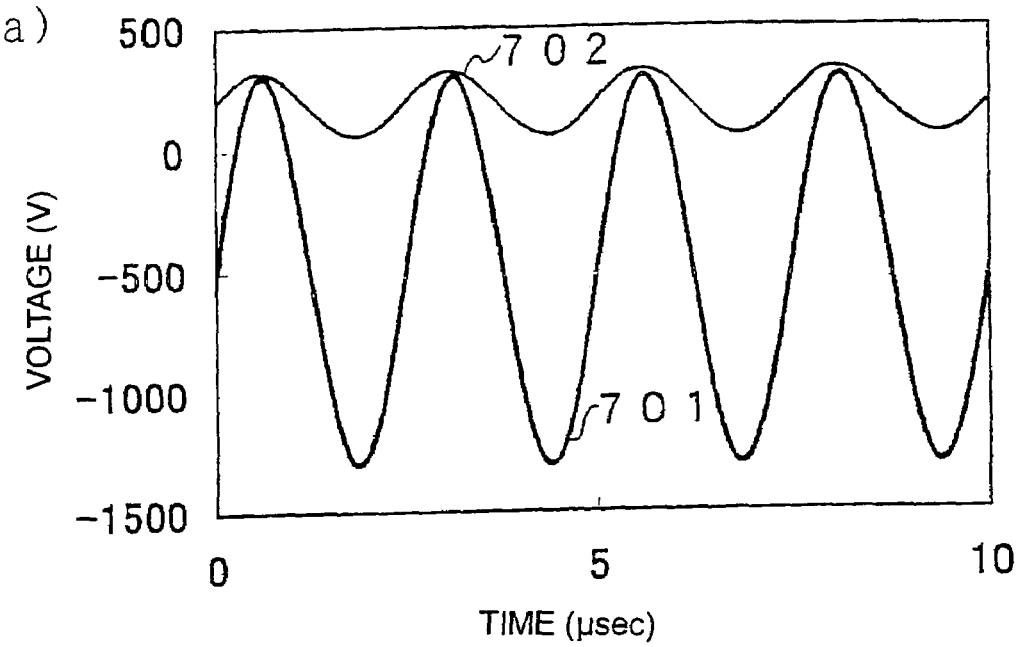
FIG. 11 shows the plasma potential and the voltage waveform generated to the object.
Figure 11:
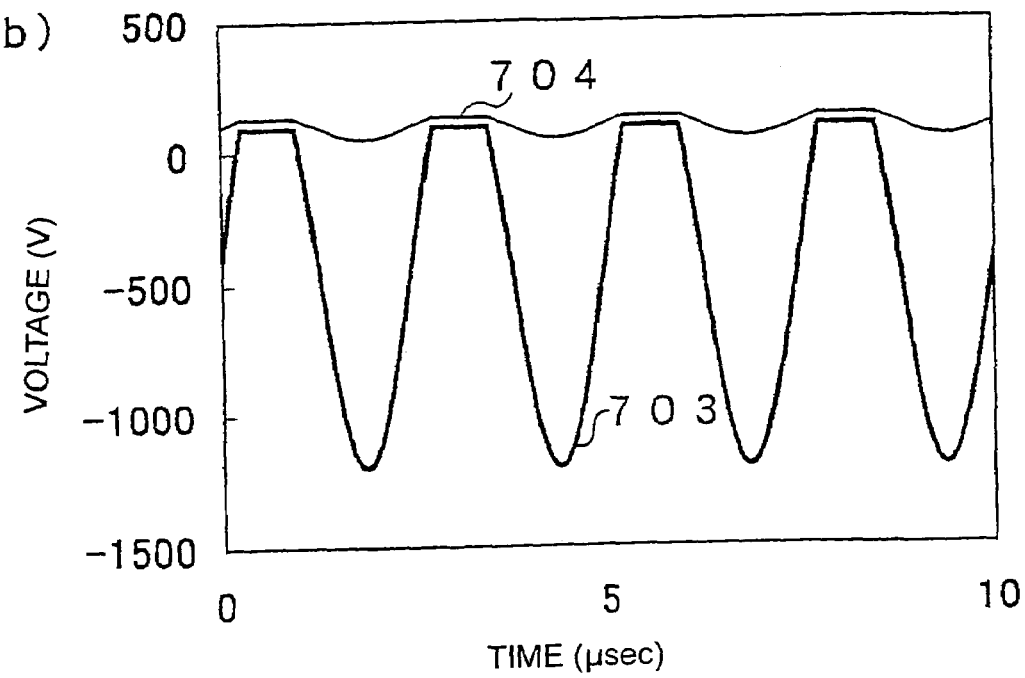

As shown in FIG. 11, the plasma potential can be controlled by adjusting the voltage waveform generated to the object 114 to be processed. Ion sheath is created near the side wall of the processing chamber 104 (effective earth portion) according to the plasma potential. Therefore, along with the increase of plasma potential, the energy of ions accelerated by the electric field within the ion sheath increases, sputtering the side walls of the processing chamber 104 and undesirably increasing metal contamination. However, if the waveform of the positive voltage is clipped as shown in FIG. 11(b) to thereby suppress increase of plasma potential, the metal contamination caused by the sputtering of side walls of the processing chamber 104 can be reduced. Thereby, a high-quality surface treatment with improved throughput and high yield factor can be achieved. In the aforementioned HARC process, a high frequency voltage with a Vpp (peak-to-peak voltage) of about 1 to 2 kV is generally applied to the wafer. However, in such case, the plasma potential also fluctuates greatly, causing the side walls of a generally-used aluminum alumite processing chamber 104 to be sputtered and generating contaminants (AlF) by the reaction with CF gases, and thereby causing the yield factor to drop. By releasing the processing chamber to the atmosphere for cleaning, the operating ratio of the apparatus including the reset time to evacuate the chamber is degraded. Moreover, the increase in plasma potential causes the plasma to be dispersed to even the bottom area of the processing chamber 14 and increasing the contaminant occurrence area, or increases the possibility of an abnormal electrical discharge (local discharge). Therefore, by clipping the positive voltage side of the sine wave, the plasma potential can be suppressed and thereby the occurrence of contaminants (AlF) can also be suppressed. Further, the dispersion of plasma to the bottom area of the processing chamber 104 can be suppressed and thereby the occurrence of abnormal electrical discharge can also be suppressed. Moreover, charging damage can be reduced by suppressing the rise of the plasma potential, so a stable plasma processing can be realized.

Especially when the outer diameter of the wafer is increased from 200 mm to 300 mm, the ratio between the wafer electrode area to which high frequency voltage is applied and the effective earth area increases, by which the absolute value of the self bias voltage drops and plasma potential increases. Therefore, the present invention suppressing the plasma potential by flattening the positive voltage-side waveform of the high frequency voltage is also effective in reducing the size of the apparatus.

Figure 12:
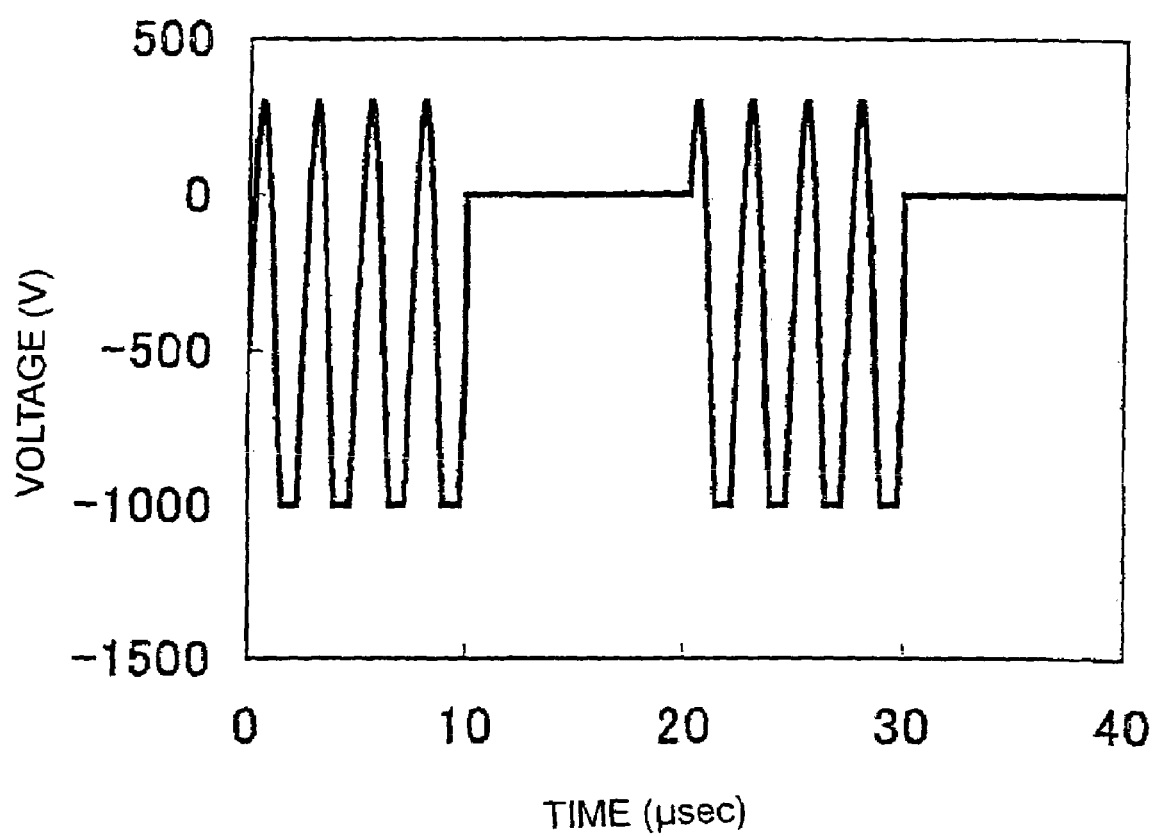
FIG. 12 shows a clip voltage waveform where a bias power supply having a duty ratio of 50% is used.

Moreover, the wafer bias power generator 117 utilized in FIGS. 1 through 11 is a continuous-wave high frequency power supply, but a time-modulation high frequency power supply (TM bias power supply) capable of performing time modulation of the amplitude of the voltage waveform can also be used. FIG. 12 shows a clip voltage waveform obtained by utilizing a TM bias power supply with a 400 kHz RF and 50% duty ratio. By controlling the duty ratio, it becomes possible to control the ratio of the etching reaction to deposition reaction in the plasma, so in combination with the ion energy control performed by clipping the wafer bias waveform, the present method realizes a more accurate etch control.

Embodiment 2

Figure 13:
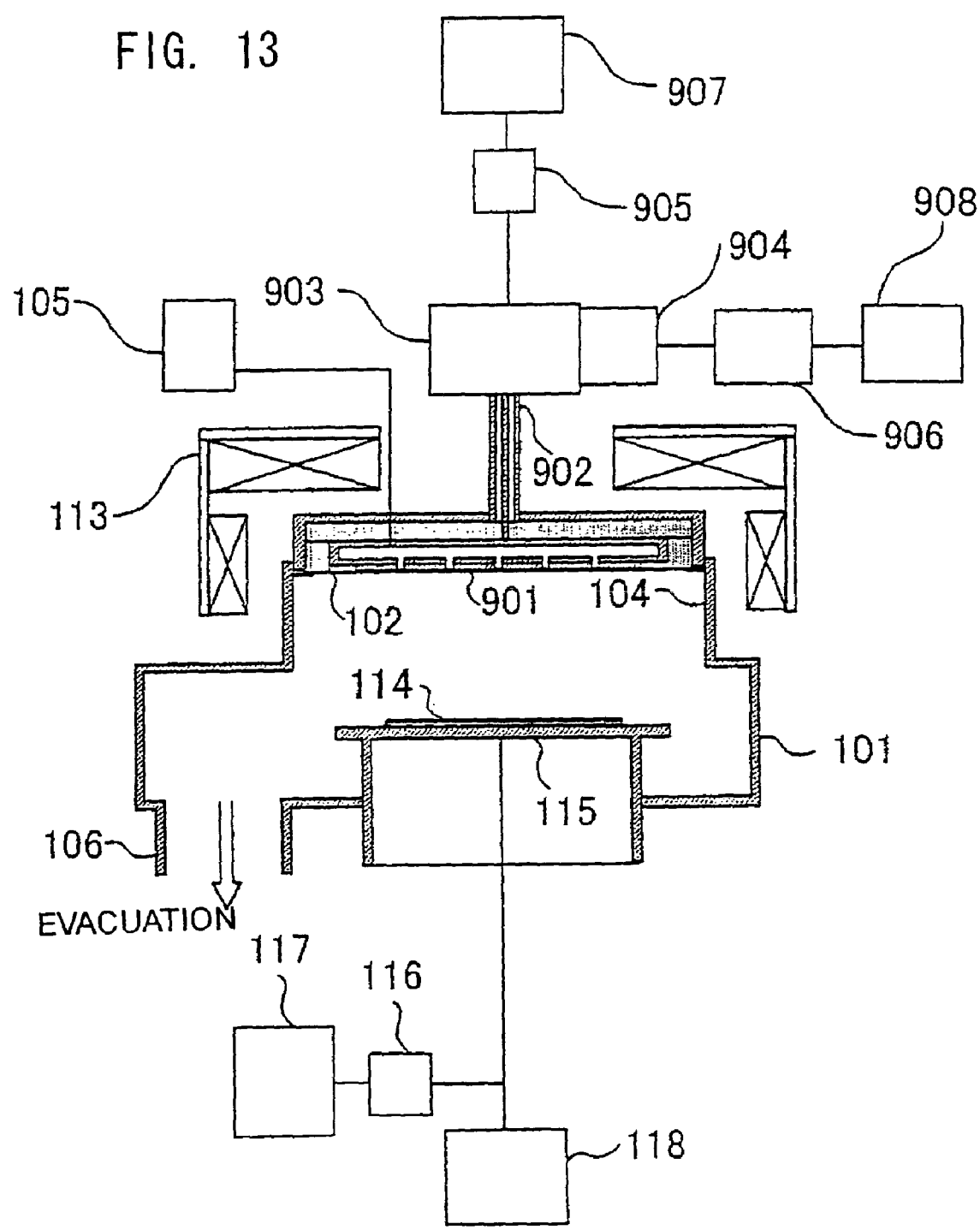
FIG. 13 is a view explaining a plasma processing apparatus according to embodiment 2 of the present invention.

A second embodiment of the present invention will now be explained with reference to FIG. 13. On the upper area of a vacuum vessel 101 having an open top portion are disposed a processing container 104, a dielectric window 102 (made for example of quartz), and an antenna electrode 901 (made for example of silicon), which are sealed to create a processing chamber 104. The antenna electrode 901 is connected to a gas feeder 105 and has a porous structure allowing the etching gas to flow through. A high frequency power supply 907 (for example, 450 MHz) and an antenna bias power supply 908 (for example, 13.56 MHz) is connected to the upper portion of the antenna electrode 901 via a coaxial line 902, an impedance matching network 903, 904 and a filter 905, 906. In the drawing, the elements equivalent to those shown in FIG. 1 are marked with the same reference numbers, and explanations thereof are omitted.

According to the illustrated apparatus, the high frequency power supplied from the power supply 907 having for example a frequency of 450 MHz in the UHF band is transmitted through the coaxial line 902 and through the antenna electrode 901 and dielectric window 102 into the processing chamber 104, where it interacts with the magnetic field formed by a magnetic field generating coil 113 (for example, a solenoid coil) to create a high density plasma within the processing chamber 104. Especially, high density plasma can be created efficiently when the magnetic field generating coil 113 creates a magnetic field having an intensity causing electron cyclotron resonance (such as 0.016 T) in the processing chamber 104. Further, the antenna bias power supply 908 provides high frequency power via the coaxial line 902 to the antenna electrode 901 which is opposed to a wafer electrode 115. A wafer bias power generator 117 provides high frequency power to an object 114 to be processed placed on the substrate electrode 115, thereby subjecting the object 114 to surface treatment (such as etching).

By providing high frequency voltage to the antenna electrode 901 by the antenna bias power supply 908, bias voltage is generated to the antenna electrode 901, which creates a reaction between the antenna electrode material and radicals within the plasma, by which the plasma composition for treating the object can be controlled. For example, when silicon is used as antenna electrode, the fluorine within the plasma can be reduced.

Thus, the present apparatus is advantageous in that the high frequency power supply 907 of 450 MHz is mainly used to generate plasma, while the antenna bias power supply 908 is used to control the plasma composition or plasma distribution, thereby enabling the plasma generation (ion flux) and plasma composition (ratio of radical concentration) to be controlled independently. Therefore, the effect of ion energy control according to the present invention can be realized even more accurately.

Embodiment 3

Figure 14:
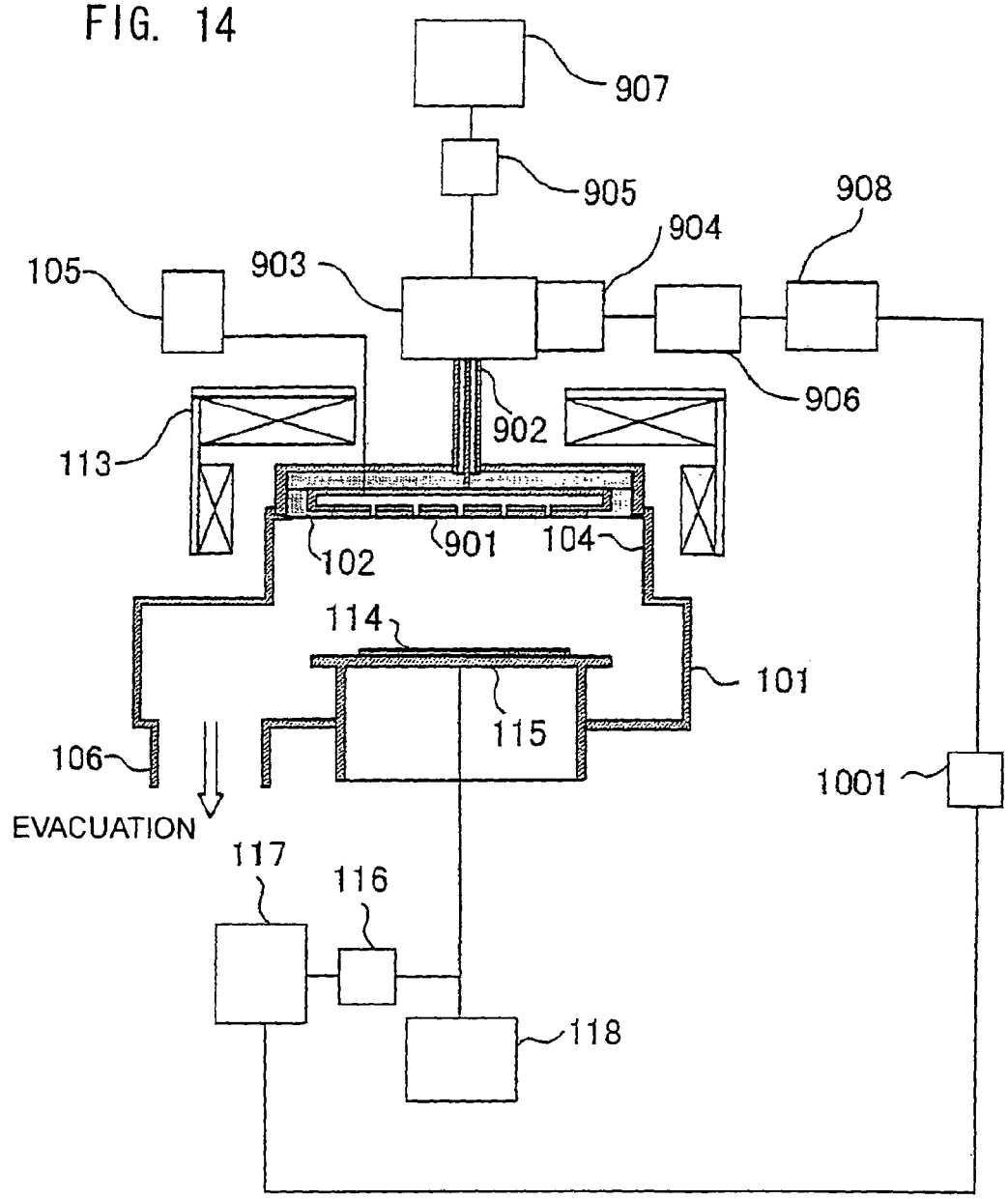
FIG. 14 is a view explaining a plasma processing apparatus according to embodiment 3 of the present invention.

The third embodiment of the present invention will be explained with reference to FIG. 14. The output of antenna bias power supply 908 (for example, 800 kHz) can be controlled by an outside trigger signal. The output of wafer bias power generator 117 (for example, 800 kHz) can also be controlled by an outside trigger signal. The antenna bias power supply 908 and wafer bias power generator 117 are connected to a phase controller 1001, by which the phase of the high frequency power output from the antenna bias power supply 908 and wafer bias power generator 117 can be controlled. In the present embodiment, the frequencies of the power supplies 908 and 117 are the same. In the drawing, the elements equivalent to those in FIG. 1 are provided with the same reference numbers, and explanations thereof are omitted.

When the high frequency voltage applied to the antenna electrode 901 and that applied to the wafer electrode 115 are in opposite phase (within the range of 180°±30°), and when positive voltage is applied to the wafer electrode 115 while negative voltage is applied to the antenna electrode 901, ions are incident on the antenna electrode 901 but electrons are not, creating an electron-rich state near the antenna electrode 901, causing the opposing wafer electrode to efficiently exert its function as earth. Therefore, the plasma potential will not depend on the high frequency power supplied from the wafer bias power generator, but will be fixed to a voltage of about 20 to 30 V which is substantially close to 0 V compared to the peak voltage value of the high frequency voltage. Thus, the present embodiment realizes the ion energy control effect of the substrate electrode 115 illustrated in embodiment 1 in a more accurate manner. Another effect of the present embodiment is that it reduces charging damage. The frequency of the wafer bias power generator 117 is set to 800 kHz in the present embodiment, but it can be set to other frequencies, such as 400 kHz or 2 Mz, to enjoy the same advantageous effects.

Though in the above embodiments, the high frequency voltage supplied from the wafer bias power generator 117 was of a sine waveform, but the present invention can also be applied to a system utilizing a substrate bias power supply 117 that is capable of supplying a high frequency voltage having a rectangular waveform. An example of such application in an effective magnetic field UHF etching apparatus is illustrated in embodiment 4.

Embodiment 4

Another embodiment of the present invention will now be explained with reference to FIGS. 15 through 21.

Figure 15:
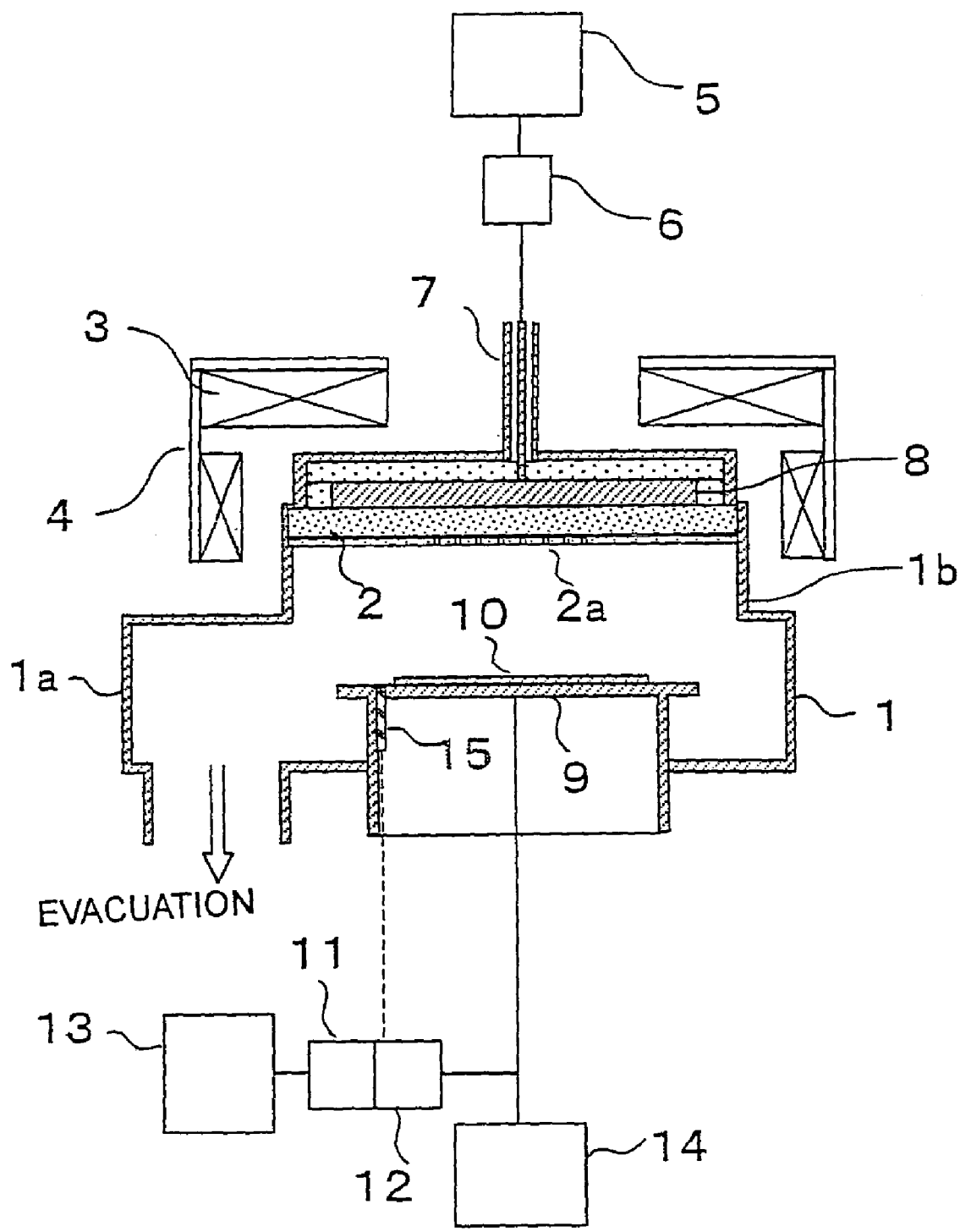
FIG. 15 is a vertical cross-sectional view showing an effective magnetic field UHF etching apparatus according to the fourth embodiment of the plasma processing apparatus of the present invention.

FIG. 15 shows an effective magnetic field UHF etching apparatus according to an embodiment of the plasma processing apparatus of the present invention. After depressurizing the interior of a processing chamber 1 defined by a vessel 1a, a discharge tube 1b and a silicon dioxide window 2 using an evacuator (not shown), etching gas is introduced to the processing chamber 1 from a gas feeder (not shown) and the interior is adjusted to desired pressure. The processing chamber 1 is positioned within a magnetic field region created by a coil 3 and a yoke 4. The output of a high frequency power supply 5, which in this case is a 450 MHz UHF wave, is transmitted via an impedance matching network 6 through a coaxial line (cable) 7, through an antenna 8 and the silicon dioxide window 2 into the processing chamber 1. The UHF wave interacts with the magnetic wave to generate plasma within the processing chamber 1. The generated plasma is used to etch a wafer 10 mounted on a wafer mounting electrode 9. Moreover, in order to control the etching form of wafer 10, the wafer mounting electrode 9 is connected to a rectangular high frequency power supply 13 via an impedance matching network 11 and a waveform controller 12, through which high frequency voltage is applied to the electrode 9. The electrode surface of the wafer mounting electrode 9 is covered with a spray film (not shown), and is connected to a DC power supply 14. Thus, wafer 10 is fixed via the spray film to the wafer mounting electrode by electrostatic chucking. A silicon dioxide shower plate 2a is provided directly under the silicon dioxide window 2, so that etching gas flows between window 2 and shower plate 2a and introduced into the processing chamber 1 through gas introduction openings provided to the center of the plate 2a. Since etching gas is fed directly above the wafer 10, highly uniform etching is made possible. A silicon dioxide cover 12 is provided to the interior of chamber 1 to prevent contamination.

The circuitry of the impedance matching network 11, the waveform controller 12 and the DC power supply 14 connected to the wafer mounting electrode 9 are the same as those of the impedance matching network 200, the clip circuit 201 and the electrostatic chucking circuit 202 shown in FIG. 2, respectively. The impedance matching network 11 comprises an inductor and a capacitor, and must have a frequency characteristic in a wide band so as to maintain the rectangular voltage waveform input through the rectangular high frequency power supply 13. The waveform controller 12 comprises semiconductor elements such as diode and FET and a capacitor. Basically, the controller has a function to clip the input waveform at an arbitrary voltage, both at positive voltage and negative voltage. Further by utilizing the capacity of the capacitor, the controller can change the waveform from a flat-clipped waveform to a waveform where the absolute value of voltage increases with time. The high frequency voltage having received waveform-shaping is applied to the wafer mounting electrode 9 via a capacitor C2 that blocks DC voltage. The DC power supply 14 is connected to the wafer mounting electrode 9 via an inductor L3. The inductor L3 prevents the inflow of high frequency voltage to the DC power supply 14.

Figure 16:
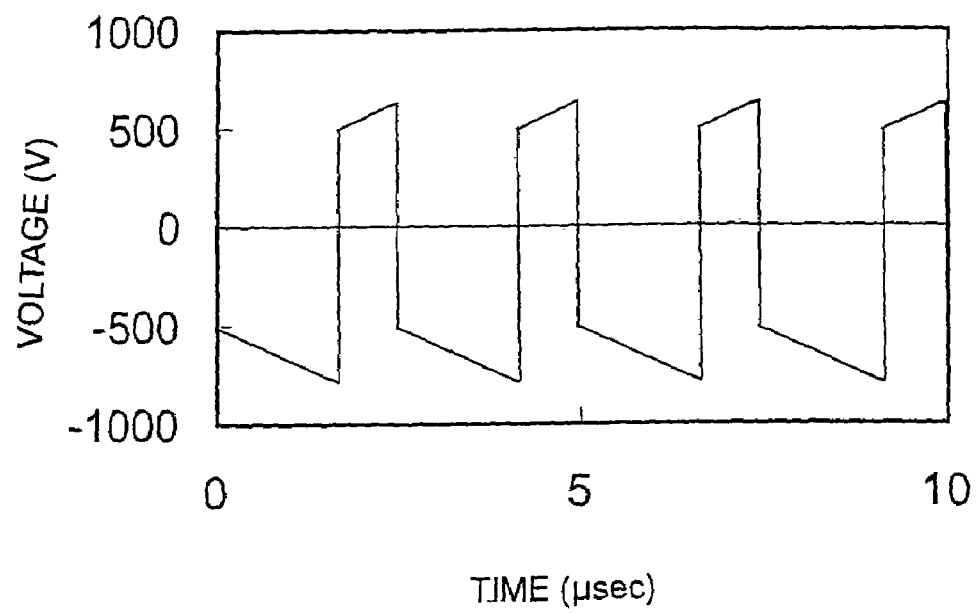
FIG. 16 shows the high frequency voltage waveform applied to a wafer mounting electrode 9 according to the fourth embodiment.
Figure 17:
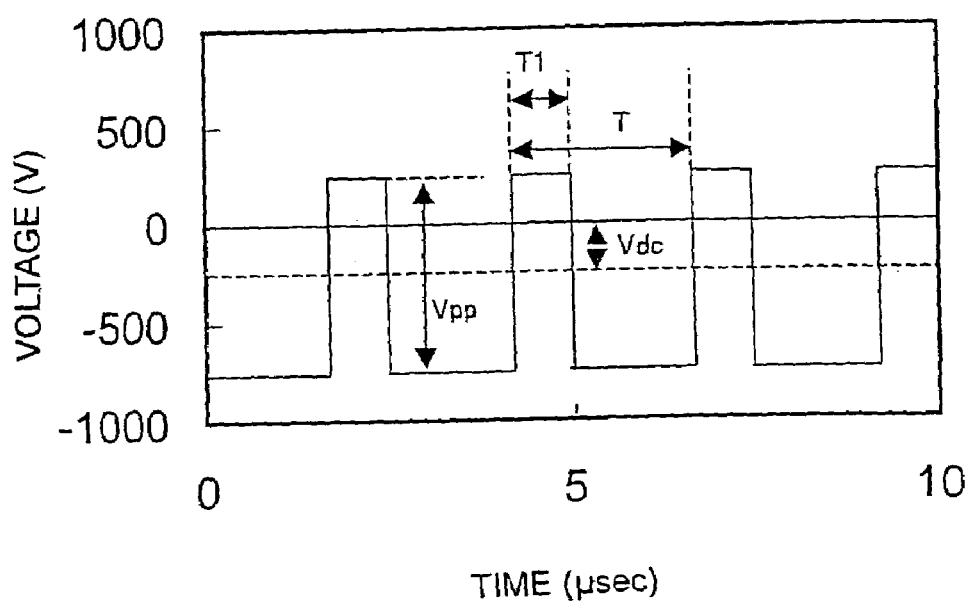
FIG. 17 shows the high frequency voltage waveform at a wafer 10 according to the fourth embodiment.
Figure 18:
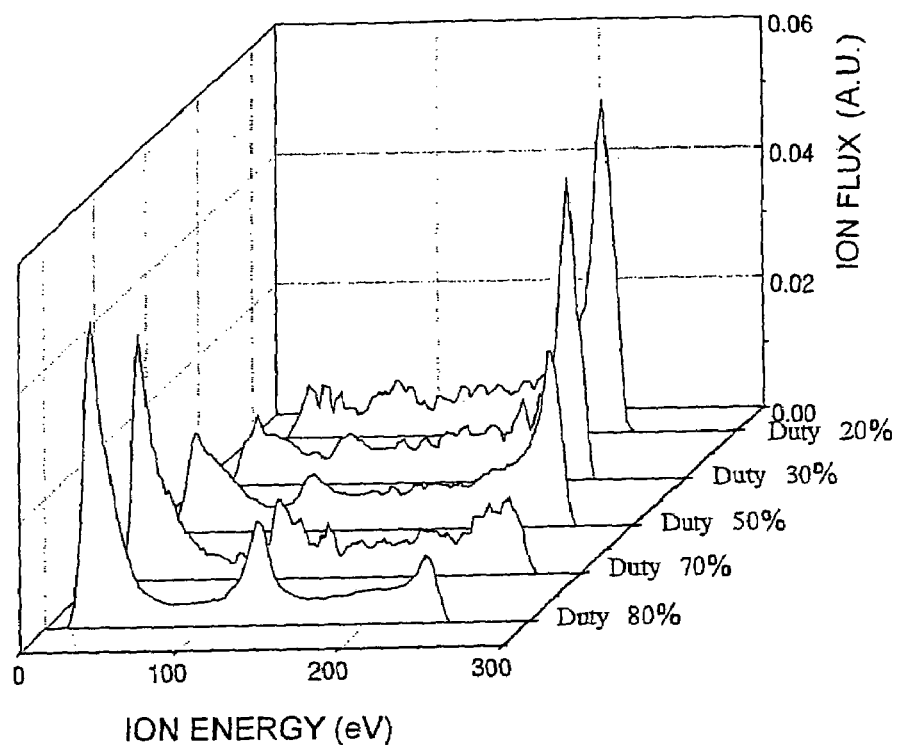
FIG. 18 shows the energy distribution of ions incident upon a wafer when the duty ratio of the rectangular high frequency voltage is varied according to the fourth embodiment.

FIG. 16 shows a waveform of the high frequency voltage applied to the wafer mounting electrode 9, and FIG. 17 shows a waveform of the high frequency voltage at wafer 10. In this example, the frequency of the voltage is 400 kHz. FIG. 18 illustrates the energy distribution of ions incident upon the wafer with the duty ratio of the rectangular high frequency voltage varied. In this example, the duty ratio is set as the application time T1 of positive voltage/cycle T of the high frequency voltage waveform, as shown in FIG. 17.

When the duty ratio is 50%, the ratio of ion flux at the high energy-side and the low energy-side is substantially 1:1, similar to the case where sine wave voltage is applied as shown in FIG. 8, but when the duty ratio is reduced, the ratio of ions at the high energy-side increases, and when the duty ratio is increased, the ratio of ions at the low energy-side increases. The response efficiency (chemical sputtering rate) of the etching increases as the ion energy is increased, so the etching rate advances as the quantity of ions at the high energy-side increases. In other words, since the ion energy distribution becomes substantially monochrome, the etching shape becomes perpendicular and highly accurate processing is made possible. This is preferably applied to gate etching requiring highly accurate perpendicular processing. Furthermore, by considering the relationship of the ion energy and chemical sputtering rate of each material to be etched and selecting the most suitable ion energy, the etching selectivity of the plurality of materials to be etched can be improved. Thus, the selectivity of the hard mask in etching a low-k insulating film or the selectivity between the base and the thin oxide film in etching a gate can be improved.

Figure 19:
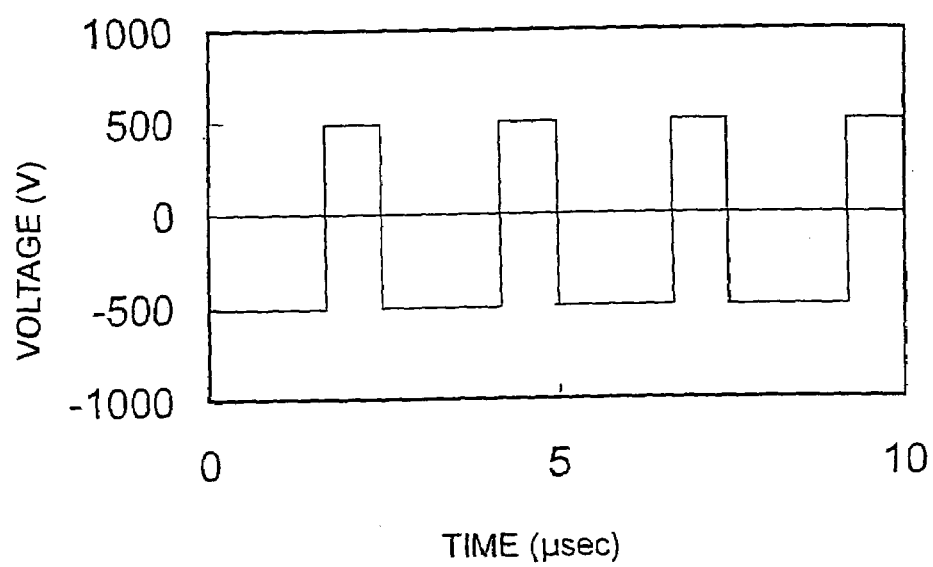
FIG. 19 shows the rectangular high frequency voltage waveform applied to a wafer mounting electrode 9 as comparative example.
Figure 20:
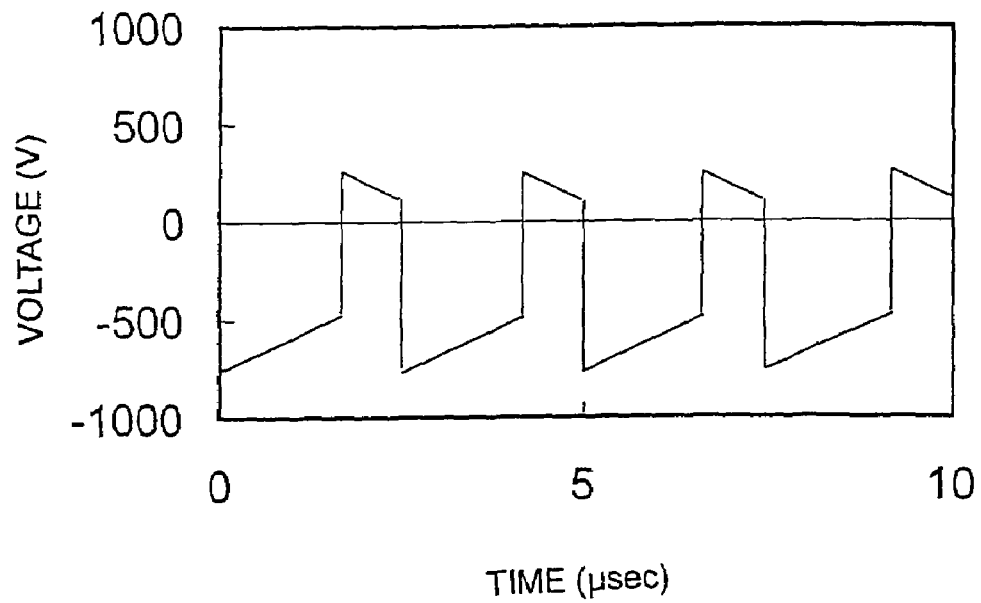
FIG. 20 shows the high frequency voltage waveform at wafer 10 when the rectangular high frequency voltage is applied to the wafer mounting electrode 9 as comparative example.

When a rectangular high frequency voltage as shown in FIG. 19 is applied to the wafer mounting electrode 9, the waveform of the high frequency voltage at wafer 10 will be as shown in FIG. 20. That is, the absolute value of the high frequency voltage reduces with time (sagging). This is because the condenser capacity of the spray film for electrostatic chuck provided on the surface of the wafer mounting electrode 9 and the plasma resistance of the generated plasma constitute an effective differentiating circuit. When the high frequency voltage at wafer 10 has a waveform as shown in FIG. 20, the ion energy distribution becomes broad, with the width of the high energy peak and low energy peak increased and peak ion flux decreased. Therefore, the etching rate, the process accuracy and the material selectivity all drop. In order to compensate for such decrease in absolute value of the high frequency voltage with time (sagging), the waveform controller 12 must adjust the absolute value of the high frequency voltage to increase with time when applying voltage to the wafer mounting electrode 9.

Thus, by applying to the wafer mounting electrode 9 a voltage having a waveform that switches between positive voltage and negative voltage with the absolute value increasing with time to thereby create a rectangular high frequency voltage at the wafer 10, a highly accurate and efficient etching is made possible and the selectivity of the material is improved.

Figure 21:
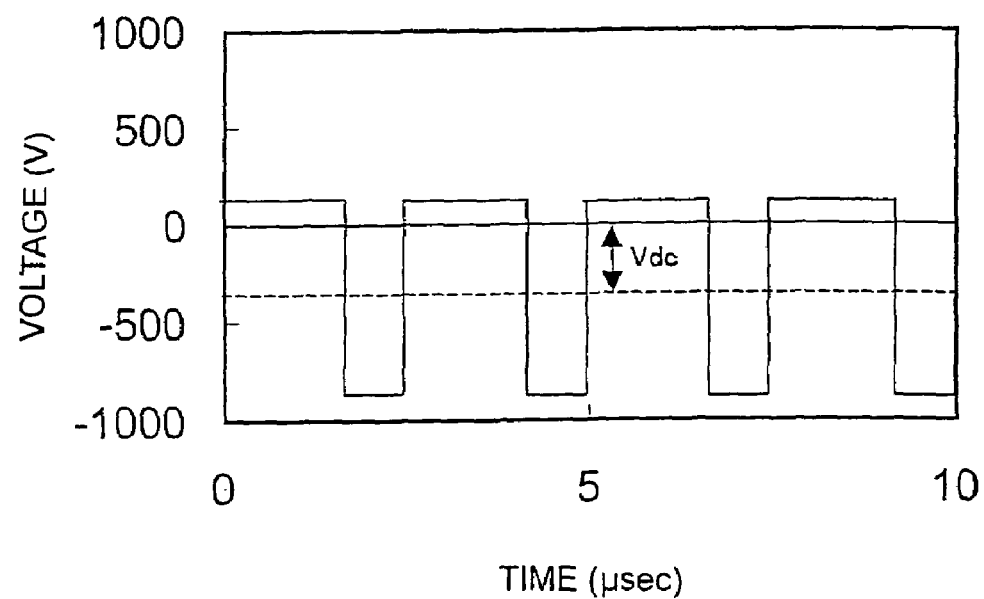
FIG. 21 is a voltage waveform at wafer 10 when the duty ratio T1/T of the rectangular wave is increased to above 50% according to the fourth embodiment.

FIG. 21 shows a voltage waveform at wafer 10 when the duty ratio T1/T of the rectangular wave is increased to over 50%. As the duty ratio increases, the absolute value Vdc of DC voltage component in the high frequency voltage increases. In other words, the positive voltage decreases. Generally, the plasma potential has a positive voltage, the plasma potential being approximately 20 V plus wafer 10 potential when the wafer 10 is at positive voltage, and being approximately 20 V when the wafer is at negative voltage. Since the processing chamber 1 is grounded, ion sheath is formed near the effective earth portion on the inner surface of the processing chamber 1, and high frequency voltage corresponding to plasma potential is applied to the ion sheath. Since the inner wall surface of the processing chamber is sputtered by ions accelerated by the field of the ion sheath, the wafer 10 is contaminated with metal, and as a result the electrical characteristic of the device is deteriorated. Further, as the area of wafer 10 having voltage applied/area of effective earth surface reduces in size, the ratio of Vdc/Vpp being the indicator of application efficiency of voltage generally increases (Vpp is the peak-to-peak voltage of high frequency voltage as shown in FIG. 17). Along with the increase in wafer diameter from 200 to 300, the ratio of area of wafer 10/area of effective earth increases and thereby the plasma potential increases, so measures against metallic contamination must be taken. According to the present embodiment, the plasma potential reduces as the duty ratio increases, by which metallic contamination can be suppressed.

According to the present embodiment, a sensor 15 can be provided to the wafer mounting electrode 9 to detect the above-mentioned sag either directly or indirectly, transmitting the result as feedback to the waveform controller 12, to thereby minimize the sag in the voltage waveform at wafer 10 and to control the voltage waveform to have a flat portion under various process conditions. The sensor 15 can be set to measure the potential of wafer 10 or other equivalent potential, or to detect a value related to plasma density. The sensor is preferably arranged near the wafer, but it can also be arranged on the side wall of the chamber 1, or outside the chamber 1 to perform non-contact detection.

Moreover, the present embodiment utilizes a rectangular high frequency power supply 13 but is not limited thereto, and other types of power supply systems can be used, including the switching system and an arbitrary voltage generator plus a high frequency power amplifier. Further, the impedance matching network can be excluded for simplification when a certain level of match is realized with the plasma load. Further for simplification, the same effect can be achieved by using an arbitrary signal generator and a high frequency power amplifier to apply to the wafer mounting electrode 9 a voltage waveform that increases in absolute value with time as shown in FIG. 16. Though the present embodiment applies a rectangular waveform as the most preferable example, a similar effect can be realized by using other waveforms such as trapezoidal waves and other similar somewhat deformed waves.

As explained, according to the various embodiments of the present invention, the waveform of the high frequency voltage applied to the wafer electrode or to the antenna bias power supply is adjusted and the ion energy distribution and plasma potential is thereby controlled, and thus a highly accurate plasma processing is made possible.

Though the present embodiments utilized the typical examples of object material to be etched, mask material, base material and various process conditions, the effects of the present invention can be achieved using other similar materials and process conditions.

Though the present embodiments were explained mainly with reference to the former processes of semiconductor device formation, the same effects can be achieved by applying the present invention to other etching processes, such as the latter steps of semiconductor device processing (contact plug, super-connect), micromachining and MEMS (in various fields including display, optical switch, telecommunication, storage, sensor, imager, small power generator, small fuel cell, microprober, processing gas control system and medical biotechnology).

The various embodiments of the present invention utilizes microwave-ECR-type and UHF-ECR-type apparatuses, but other types of devices such as other parallel plate-type RIE apparatuses, magnetron source-RIE apparatuses, double frequency excitation plasma apparatuses, surface wave excitation plasma apparatuses, VHF plasma apparatuses, TCP, ICP and ECR apparatuses, can be used.

Moreover, the present embodiments are applied to an etching apparatus, but can be applied similarly to other plasma processing apparatuses where high frequency power is supplied to the wafer electrode, such as an ashing apparatus and plasma CVD apparatus.

As explained, the present invention provides a plasma processing apparatus and plasma processing method that enable highly accurate processing.

What is claimed is:

1. A plasma processing method for providing a plasma processing to an object to be processed disposed within a vacuum processing chamber, comprising a vacuum processing chamber; a process gas feeding device for feeding process gas into the vacuum processing chamber; a wafer electrode placed within the vacuum processing chamber for mounting the object to be processed; a wafer bias power generator for applying self-bias voltage to the wafer electrode; and a plasma generating means for generating plasma within the vacuum processing chamber; wherein the plasma processing method flattens a voltage waveform of a high frequency voltage supplied by the wafer bias power generator to a voltage that varies in an inclined manner with time and flattens either a positive side voltage or a negative side voltage of the voltage waveform at an arbitrary voltage.

2. A plasma processing method for providing a plasma processing to an object to be processed disposed within a vacuum processing chamber, comprising a vacuum processing chamber; a process gas feeding device for feeding process gas into the vacuum processing chamber; a wafer electrode placed within the vacuum processing chamber for mounting the object to be processed; a wafer bias power generator for applying self-bias voltage to the wafer electrode; and a plasma generating means for generating plasma within the vacuum processing chamber; wherein the plasma processing method clips at least either a positive side voltage or a negative side voltage of a high frequency voltage of the wafer bias power generator to a predetermined voltage by flattening the high frequency voltage supplied by the wafer bias power generator to a voltage that varies in an inclined manner with time using a clip circuit connected to the wafer bias power generator.

3. A plasma processing method for providing a plasma processing to an object to be processed disposed within a vacuum processing chamber, comprising a vacuum processing chamber; a process gas feeding device for applying process gas into the vacuum processing chamber; a wafer electrode placed within the vacuum processing chamber for mounting the object to be processed; a wafer bias power generator for applying self-bias voltage to the wafer electrode; and a plasma generating means for generating plasma within the vacuum processing chamber; wherein the plasma processing method clips at least either a positive side voltage or a negative side voltage of a high frequency voltage of the wafer bias power generator to a voltage that varies in an inclined manner with time by using means for flattening the high frequency voltage which includes a clip circuit connected to the wafer bias power generator.

4. A plasma processing method according to claim 2 or 3, wherein the clip circuit comprises a diode and a DC voltage unit that are mutually connected in series, controlling the voltage of the DC voltage unit so that an absolute volume of the voltage increases with time.

5. A plasma processing method according to any one of claims 1 through 3, wherein the wafer bias power generator is a time modulation high frequency power supply turning on and off at a predetermined duty ratio.

6. A plasma processing method utilizing a plasma processing apparatus comprising a processing chamber to which is connected an evacuator for depressurizing the interior of the processing chamber; a plasma generating means for generating plasma within the processing chamber; a means for applying high frequency voltage to an object to be processed; and a gas feeding device for feeding gas into the processing chamber; wherein the plasma processing method flattens a rectangular voltage waveform of a high frequency voltage to a voltage that varies in an inclined manner with time for at least one of a positive side voltage and a negative side voltage and applies the high frequency voltage with a predetermined duty ratio to the object to be processed so that a high frequency voltage waveform generated at the object is substantially rectangular.

7. A plasma processing method according to claim 6, wherein the duty ratio of the rectangular high frequency voltage is varied according to the processing conditions of the object to be processed.

8. A plasma processing method according to any one of claims 1 through 3 or claim 6, wherein a sensor outputting a value related to the voltage generated to the object to be processed is used to flatten the voltage waveform of the object.

9. A plasma processing method according to any one of claims 2 and 3, where the high frequency voltage of the wafer bias power generator has a sine wave voltage waveform.

10. A plasma processing method according to claim 1, wherein the voltage waveform of the high frequency voltage supplied by the wafer bias power generator is a sine wave voltage waveform which is flattened by means for flattening either a positive side voltage of a negative side voltage of the sine wave voltage waveform and which includes a clip circuit connected to the wafer bias power generator.

11. A plasma processing method according to claim 6, wherein the rectangular voltage waveform of the high frequency voltage is flattened at both the positive side voltage and the negative side voltage thereof so as to provide a voltage that varies in an inclined manner with time.

12. A plasma processing method according to claim 11, wherein the rectangular voltage waveform of the high frequency voltage supplied by the means for applying high frequency voltage is flattened by a waveform controller so as to provide a voltage that varies in an inclined manner with time for both the positive side voltage and the negative side voltage.

* * * * *